(12) United States Patent
Cho et al.

(10) Patent No.: US 8,072,149 B2
(45) Date of Patent: Dec. 6, 2011

(54) UNBALANCED ION SOURCE

(75) Inventors: Jeong-Ha Cho, Kunpo (KR);
Bon-Woong Koo, Andover, MA (US);
Byung-Yeal Yoon, Yongin (KR);
Yong-Tae Kim, Hwasung (KR);
Jeong-Ho Yoon, Anynag (KR)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 919 days.

(21) Appl. No.: 12/079,978

(22) Filed: Mar. 31, 2008

(65) Prior Publication Data
US 2009/0243490 A1 Oct. 1, 2009

(51) Int. Cl.
*H01J 7/24* (2006.01)
(52) U.S. Cl. ............ 315/111.81; 250/423 R; 315/111.21
(58) Field of Classification Search ............. 315/111.81, 315/111.21, 111.31, 111.41, 111.51, 111.71; 250/423 R, 426; 313/231.31, 231.41
See application file for complete search history.

(56) References Cited

U.S. PATENT DOCUMENTS

| | | | |
|---|---|---|---|
| 4,737,688 A * | 4/1988 | Collins et al. ............ 315/111.21 |
| 5,008,002 A * | 4/1991 | Uno et al. ............... 427/530 |
| 6,184,532 B1 | 2/2001 | Dudnikov et al. |
| 6,333,969 B1 * | 12/2001 | Kujirai ..................... 378/138 |
| 6,348,764 B1 * | 2/2002 | Chen et al. .............. 315/111.81 |
| 6,525,482 B2 | 2/2003 | Miyamoto |
| 6,646,268 B2 * | 11/2003 | Murakoshi et al. ....... 250/423 R |
| 6,777,686 B2 | 8/2004 | Olson et al. |
| 7,022,999 B2 * | 4/2006 | Horsky et al. ................ 250/426 |
| 7,102,139 B2 | 9/2006 | Low et al. |
| 7,138,768 B2 * | 11/2006 | Maciejowski et al. ... 315/111.81 |
| 7,276,847 B2 * | 10/2007 | Olson et al. .................. 313/446 |
| 7,700,925 B2 * | 4/2010 | Radovanov et al. ...... 250/423 R |
| 7,800,312 B2 | 9/2010 | Horsky |
| 2006/0169915 A1 * | 8/2006 | Olson et al. .................. 250/427 |

FOREIGN PATENT DOCUMENTS

| | | |
|---|---|---|
| JP | 1125872 A | 1/1999 |
| JP | 2001167707 A | 6/2001 |

* cited by examiner

*Primary Examiner* — Jacob Y Choi
*Assistant Examiner* — Ephrem Alemu

(57) ABSTRACT

A dual unbalanced indirectly heated cathode (IHC) ion chamber is disclosed. The cathodes have different surface areas, thereby affecting the amount of heat radiated by each. In the preferred embodiment, one cathode is of the size and dimension typically used for IHC ionization, as traditionally used for hot mode operation. The second cathode, preferably located on the opposite wall of the chamber, is of a smaller size. This smaller cathode is still indirectly heated by a filament, but due to its smaller size, radiates less heat into the source chamber, allowing the ion source to operate in cold mode, thereby preserving the molecular structure of the target molecules. In both modes, the unused cathode is preferably biased so as to be at the same potential as the IHC, thus allowing it to act as a repeller.

24 Claims, 9 Drawing Sheets

US 8,072,149 B2

UNBALANCED ION SOURCE

BACKGROUND OF THE INVENTION

Ion implanters are commonly used in the production of semiconductor wafers. An ion source is used to create a beam of charged ions, which is then directed toward the wafer. As the ions strike the wafer, they impart a charge in the area of impact. This charge allows that particular region of the wafer to be properly "doped". The configuration of doped regions defines their functionality, and through the use of conductive interconnects, these wafers can be transformed into complex circuits.

A block diagram of a representative ion implanter 100 is shown in FIG. 1. Power supply 101 supplies the required energy to the ion source 102 to enable the generation of ions. An ion source 102 generates ions of a desired species. In some embodiments, these species are mono-atoms, which are best suited for high-energy implant applications. In other embodiments, these species are molecules, which are better suited for low-energy implant applications. The ion source 102 has an aperture through which ions can pass. These ions are attracted to and through the aperture by electrodes 104. These exiting ions are formed into a beam 95, which then passes through a mass analyzer 106. The mass analyzer 106, having a resolving aperture, is used to remove unwanted components from the ion beam, resulting in an ion beam having the desired energy and mass characteristics passing through resolving aperture. Ions of the desired species then pass through a deceleration stage 108, which may include one or more electrodes. The output of the deceleration stage is a diverging ion beam.

A corrector magnet 110 is adapted to deflect the divergent ion beam into a set of beamlets having substantially parallel trajectories. Preferably, the corrector magnet 110 comprises a magnet coil and magnetic pole pieces that are spaced apart to form a gap, through which the ion beamlets pass. The coil is energized so as to create a magnetic field within the gap, which deflects the ion beamlets in accordance with the strength and direction of the applied magnetic field. The magnetic field is adjusted by varying the current through the magnet coil. Alternatively, other structures, such as parallelizing lenses, can also be utilized to perform this function.

Following the angle corrector 110, the ribbon beam is targeted toward the workpiece. In some embodiments, a second deceleration stage 112 may be added. The workpiece is attached to a workpiece support 114. The workpiece support 114 provides a variety of degrees of movement for various implant applications.

Referring to FIG. 2, a traditional ion source that may be incorporated into the ion implanter 100 is shown. The ion source 102 may include a chamber housing 10 that defines an ion source chamber 14. One side of the chamber housing 10 has an extraction aperture 12 through which the ions pass. In some embodiments, this aperture is a hole, while in other applications, such as high current implantation, this aperture is a slot.

A cathode 20 is located on one end of the ion source chamber 14. A filament 30 is positioned in close proximity to the cathode 20, outside of the ion chamber. A repeller 60 is located on the opposite end of the ion source chamber 14.

The filament 30 is energized by filament supply voltage 54. The current passing through the filament 30 heats it sufficiently (i.e. above 2000° C.) so as to produce thermo-electrons. A bias supply voltage 52 is used to bias the cathode 20 at a substantially more positive voltage than the filament 30. The effect of this large difference in voltage is to cause the thermo-electrons emitted from the filament to be accelerated toward the cathode. As these electrons bombard the cathode, the cathode heats significantly, often to temperatures over 2000° C. The cathode, which is referred to as an indirectly heated cathode (IHC), then emits thermo-electrons into the ion source chamber 14.

The arc supply 50 is used to bias the ion chamber housing 10 positively as compared to the cathode. The arc supply typically biases the housing 10 to a voltage about 50-100 Volts more positive than the cathode 20. This difference in voltage causes the electrons emitted from the cathode 20 to be accelerated toward the housing 10.

A magnetic field is preferably created in the direction 62, typically by using magnetic poles 86 located outside the chamber. The effect of the magnetic field is to confine the emitted electrons within magnetic field lines. The emitted electrons, electro-statically confined between cathode and repeller, take the spiral motions along the source magnetic field lines, thus effectively ionize background gases, forming ions (as shown in FIG. 3).

Vapor or gas source 40 is used to provide atoms or molecules into the ion source chamber 14. The molecules can be of a variety of species, including but not limited to inert gases (such as argon or hydrogen), oxygen-containing gases (such as oxygen and carbon dioxide), nitrogen containing gases (such as nitrogen or nitrogen triflouride), and other dopant-containing gases (such as diborane, boron tri-fluoride, or arsenic penta-fluoride). These background gasses are ionized by electron impact, thus forming plasma 80.

At the far end of the chamber 14, opposite the cathode 20, a repeller 60 is preferably biased to the same voltage as the cathode 20. This causes the emitted electrons to be electro-statically confined between cathode 20 and repeller 60. The use of these structures at each end of the ion source chamber 14 maximizes the interaction of the emitted electrons with the background gas, thus generating high-density plasmas.

FIG. 3 shows a different view of the ion source of FIG. 2. The source magnet 86 creates a magnetic field 62 across the ion chamber. The cathode 20 and repeller 60 are maintained at the same potential, so as to effectively confine the electrons, which collide with the background gas thus generate the plasma 80. The electrode set 90 is biased so as to attract the ions to and through the extraction aperture 12. These extracted ions are then formed into an ion beam 95 and are used as described above.

The above described technique of generating ions is highly effective for high-energy implant applications. Applications using high implant energies typically utilize mono-atoms, which are preferably created through the use of emitted electrons via an indirectly heated cathode. The indirectly heated cathode coupled with the magnetic fields, creates an environment where molecules are broken down into mono-atomic ion species. In these applications, source gas which breakdown into mono-atoms, such as $H_2$, $NF_3$, and $B_2H_6$, are supplied to the ion chamber. However, there are applications where such ions are not desirable. For example, there are applications that require ultra shallow junction formation, obtained with very low energy implants. Due to their inefficiency of beam transport, low energy applications preferably require the use of heavier charged molecules. These heavier molecules, such as decaborane, carborane and others, cannot be ionized using the above technique, since the high temperature environment would break apart the heavy molecules into smaller molecules or atoms. It is important for these applications that the molecules retain their molecular structure, losing only electrons before being extracted from the chamber.

Therefore, to create these heavier ions, alternative ion sources are typically used. In most cases, the ion source operates at much lower temperatures to preserve the molecular structure of the target species. In some embodiments, RF power is used to ionize the molecules.

Thus, there are two distinct modes of operation; one used for generating atomic ion species for high-energy applications, also known as hot mode, and a second for generating molecular ion species for low-energy applications, also known as cold mode. Because there are two distinct modes, there are typically separate ion sources, depending on the application and the source molecules. This complicates the ion implanter, and increases cost and complexity. A single ion source that can effectively generate ions for use in both modes, i.e. mono-atomic ions for high-energy implant applications and molecular ions for lower-energy implant applications, would be very beneficial.

SUMMARY OF THE INVENTION

The problems of the prior art are addressed by the present disclosure, which describes a dual-mode, unbalanced indirectly heated cathode (IHC) ion source chamber. The cathodes have different surface areas, thereby affecting the amount of heat radiated by each. In the preferred embodiment, one cathode is of the size and dimension typically used for an IHC ion source, as traditionally used for hot mode operation. The second cathode, preferably located on the opposite wall of the chamber, is of a smaller size. This smaller cathode is still indirectly heated by a filament, but due to its smaller size, radiates less heat into the source chamber, allowing the ion source to operate overall in cold mode, thereby preserving the molecular structure of the target molecules.

In both modes, the unused cathode is preferably biased so as to be at the same potential as the IHC, thus allowing it to act as a repeller. In another embodiment, the smaller cathode (i.e. the cathode for cold mode operation) is surrounded by an electrically conductive ring, which is biased to the same potential as the smaller cathode in hot mode. However, the ring is thermally separated from the cathode (either using an insulating material or via an air gap).

DETAILED DESCRIPTION OF THE INVENTION

Figure 1:
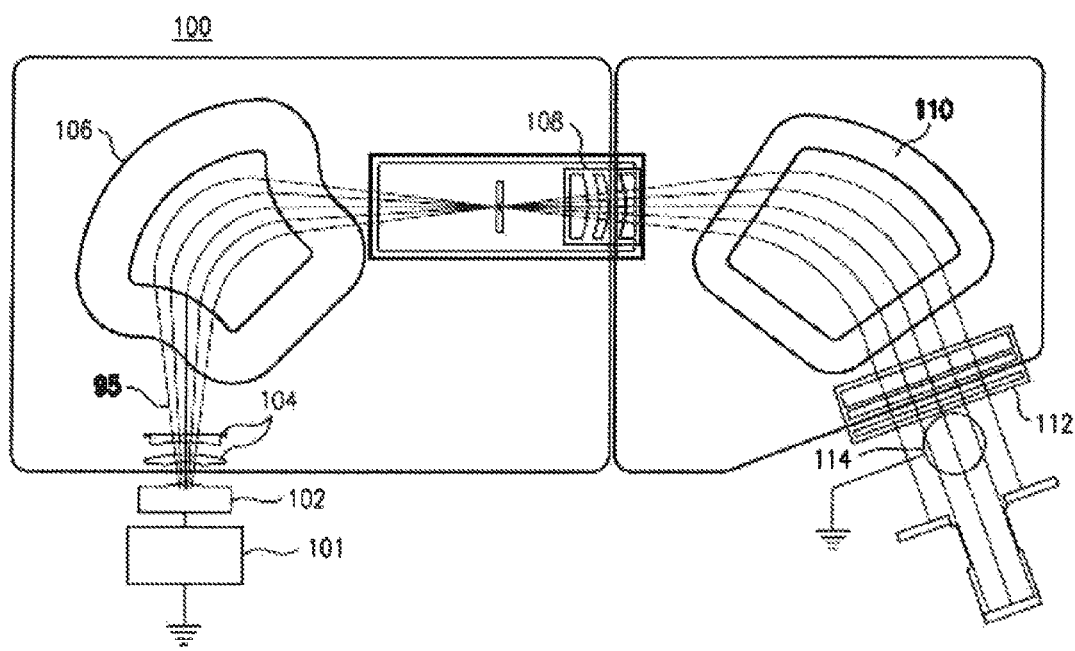
FIG. 1 illustrates a block diagram of a representative high-current ion implanter tool.
Figure 2:
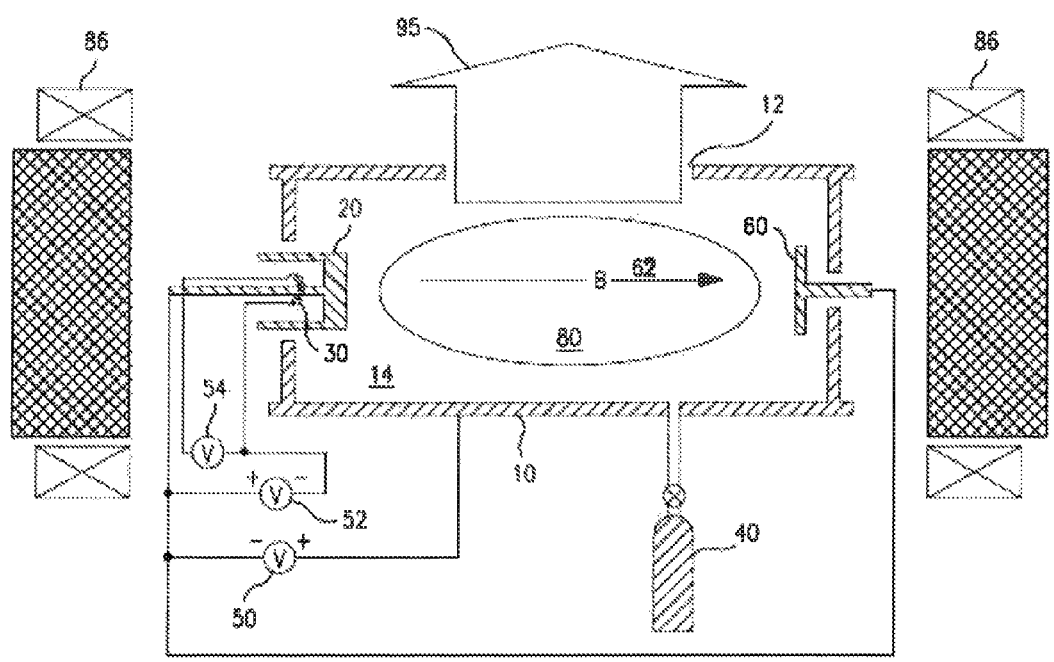
FIG. 2 illustrates a traditional ion source.
Figure 4:
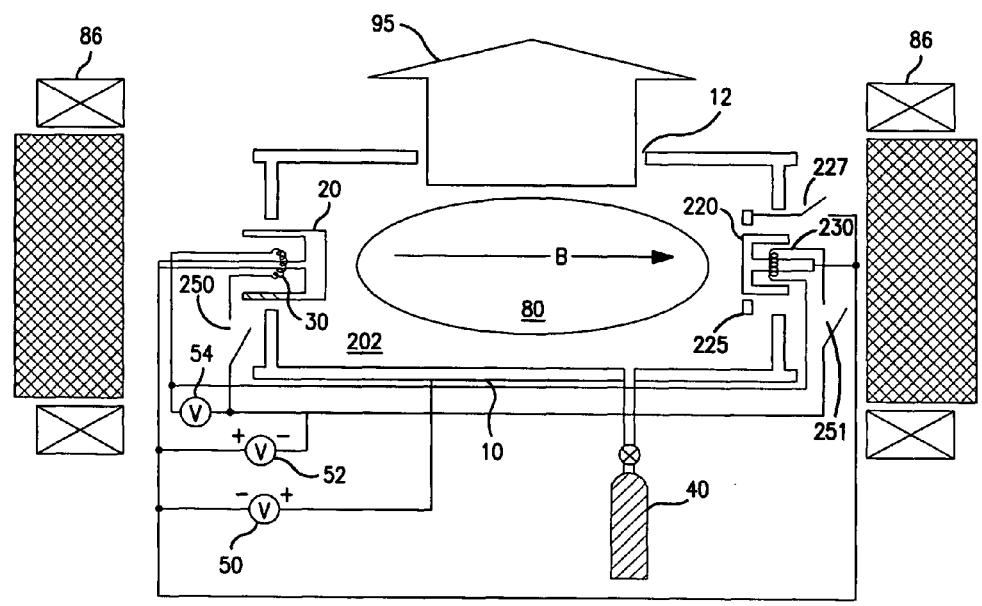
FIG. 4 illustrates a first embodiment.

FIG. 4 illustrates a first embodiment. Those elements that are common with those of a traditional ion source, as shown in FIG. 2, are given like reference designators. In place of the repeller, a second cathode 220, having a surface area smaller than that of the first cathode 20, is utilized. In certain embodiments, the second cathode may have a different geometry than the first cathode. For example, the second cathode may have a different shape or thickness than the first cathode. In other embodiments, the second cathode has the same shape as the first cathode with reduced dimensions, thereby reducing its surface area. This second cathode 220 is preferably connected to the bias supply 52, so as to be at the same potential as first cathode 20. Cathode ring 225 is also preferably connected to bias supply 52, so as to be at the same potential as both cathodes. However, it is contemplated that each of the first cathode 20, the second cathode 220, and the cathode ring 225 may be biased at different potentials. Optionally, a switch 227 is utilized to selectively activate the bias potential, as will be explained below. In another embodiment, cathode ring 225 is not utilized, thus creating a much smaller repeller when the ion source is used in the hot mode.

In close proximity to cathode 220 is filament 230. This filament is heated using filament supply 54. Note that switches 250,251 have been inserted such that filaments 30, 230 can be turned on independently or simultaneously. Optionally, a second filament power supply can also be utilized to supply current to filament 230, if desired. The position of filament 230 and the shape of cathode 220 are such as to maximize the percentage of emitted thermo-electrons that impact the cathode 220, while minimizing the amount that impact the cathode ring 225. Optionally, the bias supply 52 can be disconnected from the cathode ring 225, leaving the cathode ring 225 electrically either floated or grounded to the source chamber 10 so that emitted electrons are not as attracted to the cathode ring 225. This serves to minimize the overall thermal budget in the ion source chamber 14 and thermo-electron-containing plasma volume where most of molecular breakdown occurs, while providing enough electrons for generating molecular ion species.

Figure 3:
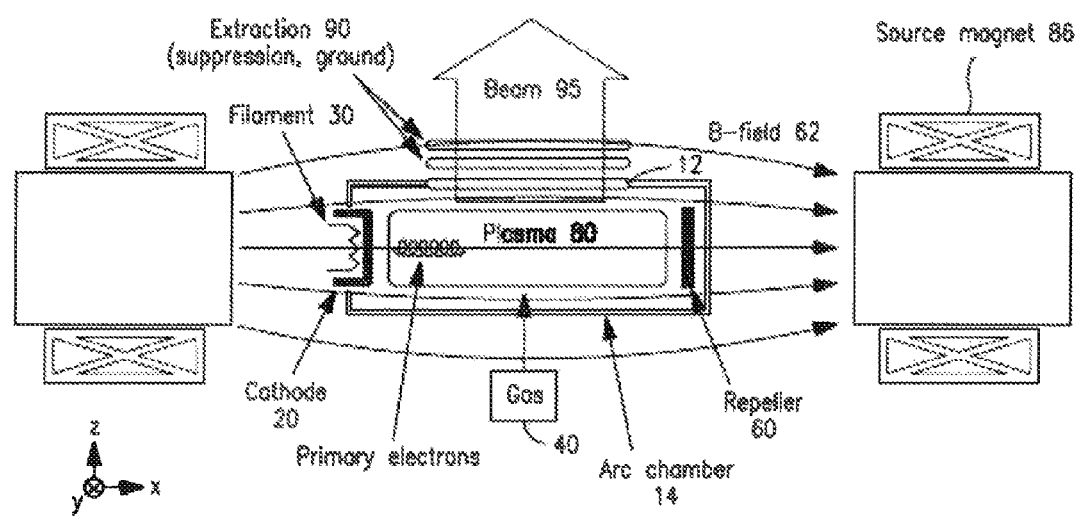
FIG. 3 shows the major components of the traditional ion source of FIG. 2.
Figure 5:
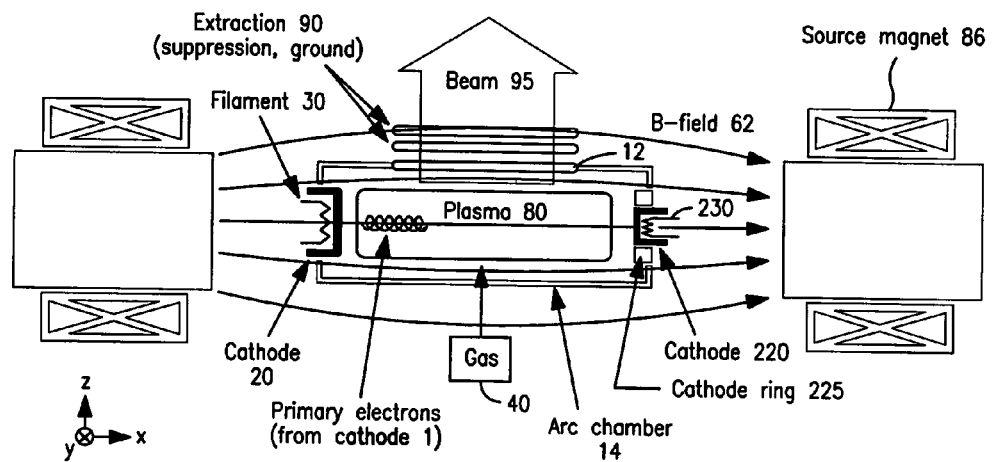
FIG. 5 shows the embodiment of FIG. 4 as used in hot mode.

FIG. 5 shows the operation of an ion source in hot mode. In this case, the cathode 220 and cathode ring 225 are similarly biased so as to act as the traditional repeller of the prior art. Switch 250 is closed allowing current to flow through filament 30. However, switch 251 is open, preventing the operation of filament 230. Thus, the ion source behaves exactly as that shown in FIGS. 2 and 3.

Figure 6:
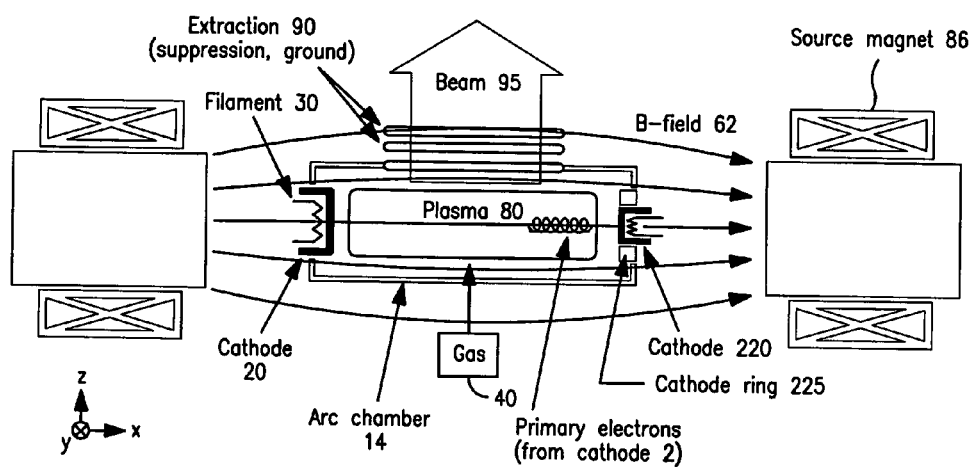
FIG. 6 shows the embodiment of FIG. 4 as used in cold mode.

FIG. 6 shows the operation of an ion source in cold mode. In this case, the cathode 20 serves as the repeller and is biased to the same potential as cathode 220. Switch 250 is open, preventing the electric current through filament 30. However, switch 251 is closed, allowing current to flow through filament 230. Cathode 220 is positively biased as compared to the filament, thus attracting the emitted thermo-electrons. Cathode ring 225 may be, for example, physically shielded from the filament 230, or electrically biased so as not to attract emitted electrons from the filament. Thus, cathode ring 225 is not heated to the degree that the cathode 220 is heated.

Cathode 220 heats sufficiently so as to emit thermo-electrons. Since its surface area is much smaller than that of cathode 20, it radiates far less heat into the ion source chamber 14. Furthermore, cathode ring 225 is not heated by the filament, and thus does not add any heat to the ion source chamber 14. Rather, the cathode ring 225 may serve as a heat sink absorbing heat from the nearby cathode 220. Thus, the chamber 14 reaches a much lower internal temperature in this mode, than in hot mode. This lower temperature enables molecules to retain their structure during the electron bombardment. Ionized molecules then exit the ion source chamber 14 via the extraction aperture 12.

Figure 7:
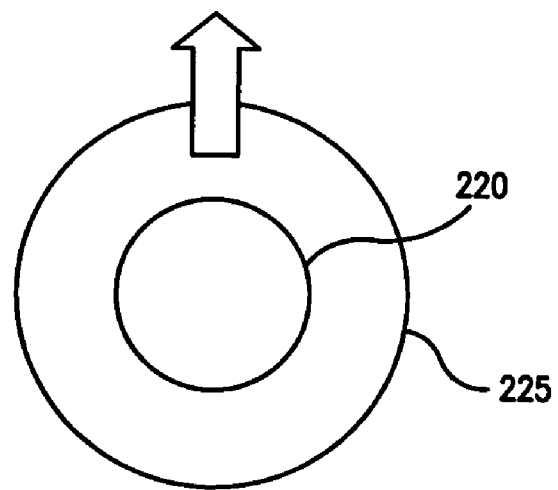
FIG. 7 illustrates one embodiment of the cathode ring.

FIG. 7 shows one embodiment of the cathode ring 225. The ring, in this embodiment, is annular in shape and surrounds cathode 220. The size of the cathode ring 225 is determined in part by its role as a repeller in hot mode. As stated above, cathode 20 will emit thermo-electrons in hot mode. Because of the effect of the applied magnetic field, these thermo-electrons tend to be confined along the magnetic field lines, whose shape and volume is roughly defined by the shape of the cathode. In other words, the electrons will appear to travel within a tube where the outer circumference roughly corresponds to the circumference of the cathode 20. Since this tube extends beyond the circumference of cathode 220, some of the emitted electrons may not be confined as desired, but lost to the source chamber housing 10. Thus, a cathode ring 225, having the same potential as cathode 220, is used to create a repeller having the same size and shape as the cathode 20.

From the above description, those of ordinary skill in the art will recognize that the combination of the cathode 220 and the cathode ring 225 should be such that it presents a surface having an area that is comparable to that of the emitting cathode 20, thereby allowing it to act as a repeller. However, while FIG. 7 shows the cathode ring 225 being annular in shape and surrounding the cathode 220, the present disclosure is not limited to this embodiment.

Figure 8A:
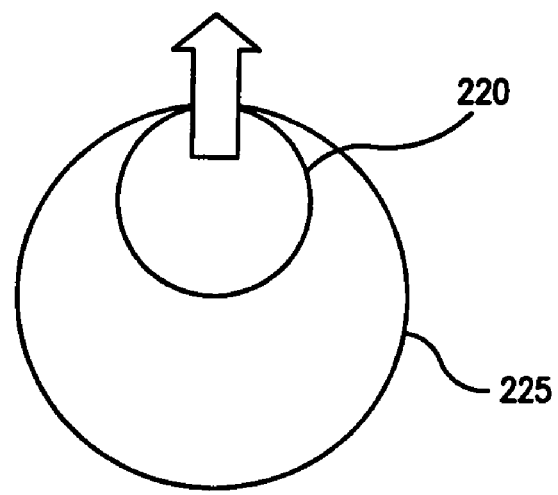
FIG. 8a illustrates a second embodiment of the cathode ring.
Figure 8B:
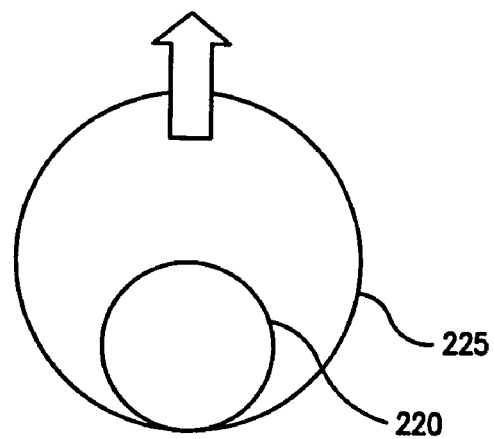
FIG. 8b illustrates a third embodiment of the cathode ring.
Figure 8C:
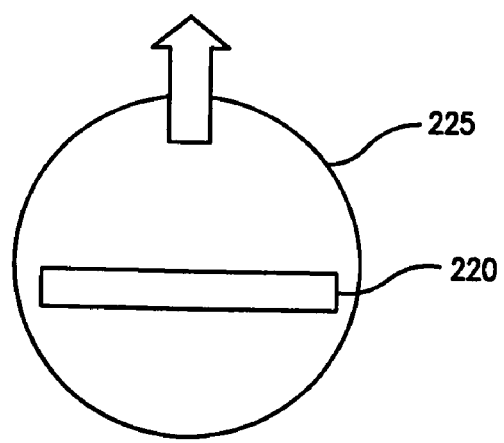
FIG. 8c illustrates a fourth embodiment of the cathode ring.

For some applications, it may be beneficial to have the cathode 220 positioned as close to the extraction aperture 12 as possible, to maximize the extraction of the molecular ions created and extracted in cold mode. In this case, the cathode ring 225 is not annular, rather it is shaped so that the combination of it and the cathode 220 results is a generally circular shape. FIG. 8a shows a second embodiment of the cathode ring, configured to allow cathode 220 to be positioned close to the extraction aperture 12. Alternatively, it may be desirous that the cathode 220 be placed as far from the extraction aperture 12 as possible. In this case, the cathode ring of FIG. 8b is preferred. Other shapes for the cathode ring, such as that shown in FIG. 8c are also contemplated and within the scope of the disclosure.

The size of cathode 220 may be beneficial in determining its effectiveness during cold mode. Since the electron emission density from a given cathode surface is a function of surface temperature, the approximate amount of heat radiated by the cathode is proportional to its surface area. Thus, if cathode 220 has a diameter that is ⅓ that of the hot mode cathode 20, it will radiate only about 10% as much heat as hot mode cathode 20. The disclosure is not limited to this dimension; other dimensions, having a surface area smaller than the cathode 20 for hot mode operation, are contemplated and within the scope of the disclosure.

While the above description recites the use of only one cathode at a time, the disclosure is not so limited. In certain applications, it may be beneficial to enable switches 250, 251 simultaneously or substantially simultaneously so that both cathodes 20, 220 are emitting electrodes. This has the added advantage of having heat generators at both ends of the ion source chamber 14, while helps maintain a more uniform temperature throughout the ion source chamber.

Figure 9:
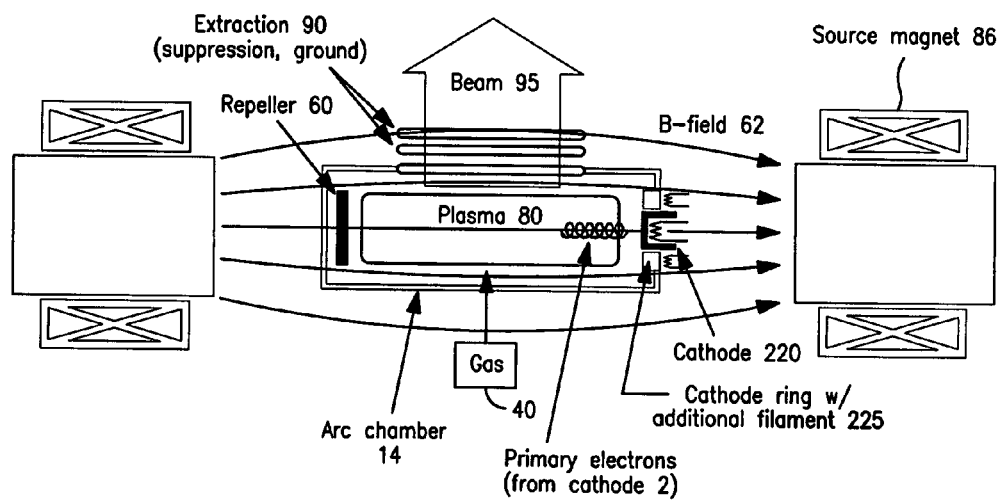
FIG. 9 illustrates a second embodiment.

Moreover, while the above description recites the use of two physically separate unbalanced IHC cathodes, the disclosure is not limited to only this embodiment. The cathode arrangement shown in FIGS. 7 and 8 can be used to create appropriate cathodes for use in both hot and cold modes. In this embodiment, the cathode ring 225 can be used as either an IHC or can be disabled. Referring to FIG. 9, unitary cathode 20 is replaced by the combination of cathode 220 and cathode ring 225, which together form a cathode unit. In one embodiment, two filaments are employed where one is directed toward cathode 220 and the second is directed toward cathode ring 225. Switches 250, 251 determine which filaments are energized.

For cold mode, switch 251 is closed and switch 250 is open, allowing the filament directed toward the cathode 220 to be energized, while the filament directed toward cathode ring 225 is disabled. The cathode 220 is heated and emits electrons, as described above. A repeller 60 is located on the opposite side of the chamber and electrostatically confines the electrons, pushing them back toward the middle of the ion source chamber 14. In hot mode, both switches are closed and the filaments heat both the cathode 220 and the cathode ring 225. In this configuration, the resulting structure resembles in size and shape the traditional IHC used in hot mode operation.

In a second embodiment, a single filament is used, but differing electrical potentials are used to direct the emitted electrons either toward the cathode 220, or toward both the cathode and the cathode ring 225. By making the cathode 220 much more positively biased than the cathode ring 225, electrons emitted from the filament will be accelerated toward the cathode 220, thus operating the ion source in cold mode. If both the cathode and cathode ring are biased to the same potential, the electrons emitted from the filament will be equally attracted to both the cathode and the cathode ring, thereby creating hot mode operation.

While this disclosure describes specific embodiments disclosed above, those of ordinary skill in the art will recognize that many variations and modifications are possible. For example, while the description discloses a ribbon beam, the disclosure is not so limited and can also be employed with systems that utilize spot beams.

Accordingly, the embodiments presented in this disclosure are intended to be illustrative and not limiting. Various embodiments can be envisioned without departing from the spirit of the disclosure.

What is claimed is:

1. An ion source comprising:
   an ion chamber housing defining an ion source chamber;
   an indirectly heated cathode used to emit electrons in a first and second operating mode, wherein said indirectly heated cathode is adapted to ionize a second background gas at relatively low temperatures in said second mode; and
   a cathode ring disposed proximate to said indirectly heated cathode, such that said cathode ring and said indirectly heated cathode together form a cathode unit used to emit electrons in said first operating mode, wherein said cathode unit is adapted to ionize a first background gas at relatively high temperatures in said first operating mode.

2. The ion source of claim 1, further comprising a repeller located on the opposite end of said ion source chamber wherein said repeller is biased to confine the electrons emitted from said indirectly heated cathode in said second operating mode and said cathode unit in said first operating mode.

3. The ion source of claim 2, wherein said repeller comprises a structure substantially equal in size and shape to said cathode unit.

4. The ion source of claim 1, further comprising a first filament located outside said ion source chamber, wherein a current is passed through said first filament in said first operating mode and said second operating mode, and said indirectly heated cathode is indirectly heated by electrons emitted by said first filament.

5. The ion source of claim 4, further comprising a second filament located outside said ion source chamber, wherein a current is passed through said second filament in said second operating mode, and said cathode ring is indirectly heated by electrons emitted by said second filament.

6. The ion source of claim 4, wherein said first filament is located such that said cathode ring is shielded from said emitted electrons.

7. The ion source of claim 4, wherein said cathode ring is biased so that said emitted electrons are attracted toward said indirectly heated cathode.

8. An ion source comprising:
an ion chamber housing defining an ion source chamber;
a first indirectly heated cathode used to emit electrons in a first operating mode;
a second indirectly heated cathode, having a smaller surface area than said first indirectly heated cathode, used to emit electrons in a second operating mode; and
a cathode ring located near said second indirectly heated cathode, shaped and configured such that, said cathode ring and said second indirectly heated cathode together form a structure substantially equal in size and shape to said first indirectly heated cathode.

9. The ion source of claim 8, wherein said first indirectly heated cathode is adapted to ionize a first background gas at relatively high temperatures, and said second indirectly heated cathode is adapted to ionize a second background gas at relatively low temperatures.

10. The ion source of claim 8, wherein said cathode ring is biased to confine the electrons emitted from said first indirectly heated cathode in said first operating mode.

11. The ion source of claim 8, wherein said cathode ring and said second indirectly heated cathode are biased to the same potential in said first operating mode.

12. The ion source of claim 8, wherein said second indirectly heated cathode is a different shape than said first indirectly heated cathode.

13. The ion source of claim 8, wherein said first indirectly heated cathode and said second indirectly heated cathode are located at opposite ends of said ion chamber housing.

14. The ion source of claim 13, wherein said second indirectly heated cathode is biased to confine the electrons emitted from said first indirectly heated cathode in said first operating mode and said first indirectly heated cathode is biased to confine the electrons emitted from said second indirectly heated cathode in said second operating mode.

15. The ion source of claim 8, further comprising a first filament located outside said ion chamber housing, wherein a current is passed through said first filament in said first operating mode, and said first indirectly heated cathode is indirectly heated by electrons emitted by said first filament.

16. The ion source of claim 15, further comprising a second filament located outside said ion chamber housing, wherein a current is passed through said second filament in said second operating mode, and said second indirectly heated cathode is indirectly heated by electrons emitted by said second filament.

17. The ion source of claim 16, wherein electrons emitted by said second filament do not impact said cathode ring.

18. The ion source of claim 17, wherein said second filament is located such that said cathode ring is shielded from said emitted electrons.

19. The ion source of claim 17, wherein said cathode ring is biased so that said emitted electrons are attracted toward said second indirectly heated cathode.

20. A method for generating ions in an ion source chamber, comprising:
supplying a first background gas to said ion source chamber in a first operating mode;
ionizing said first background gas in said first operating mode using electrons emitted by a first indirectly heated cathode;
supplying a second background gas to said ion source chamber in a second operating mode;
providing a cathode ring located near a second indirectly heated cathode, shaped and configured such that said cathode ring and said second indirectly heated cathode together form a structure substantially equal in size and shape to said first indirectly heated cathode, said second indirectly heated cathode having: a surface area smaller than said first indirectly heated cathode; and
ionizing said second background gas in said second operating mode using electrons emitted by said second indirectly heated cathode, wherein said ion source chamber supplies ions of said first background gas in said first operating mode and ions of said second background gas in said second operating mode.

21. The method of claim 20, further comprising biasing said second indirectly heated cathode so as to confine electrons emitted by said first indirectly heated cathode in said first operating mode and biasing said first indirectly heated cathode so as to confine electrons emitted by said second indirectly heated cathode in said second operating mode.

22. The method of claim 20, further comprising biasing said cathode ring so as to repel electrons emitted by said first indirectly heated cathode in said first operating mode.

23. The method of claim 20, further comprising providing a first filament located outside said ion source chamber, and passing a current through said first filament in said first operating mode, so that said first indirectly heated cathode is indirectly heated by electrons emitted by said first filament.

24. The method of claim 23, further comprising providing a second filament located outside said ion source chamber, and passing a current through said second filament in said second operating mode, so that said second indirectly heated cathode is indirectly heated by electrons emitted by said second filament.

* * * * *